United States Patent [19]
Hardy et al.

[11] Patent Number: 4,525,763
[45] Date of Patent: Jun. 25, 1985

[54] APPARATUS AND METHOD TO PROTECT MOTORS AND TO PROTECT MOTOR LIFE

[75] Inventors: Robert M. Hardy; William J. Premerlani, both of Scotia, N.Y.

[73] Assignee: General Electric Company, Schenectady, N.Y.

[21] Appl. No.: 556,744

[22] Filed: Nov. 30, 1983

[51] Int. Cl.³ .............................................. H02H 7/08
[52] U.S. Cl. ...................................... 361/24; 361/25; 361/27; 324/158 MG; 318/472
[58] Field of Search ....................... 361/24, 25, 27, 31, 361/23, 28, 103, 106; 318/471, 472, 473, 783, 254; 324/158 MG; 364/474, 511

[56] References Cited
U.S. PATENT DOCUMENTS 4,319,298  3/1982  Davis et al. ............................ 361/24
4,351,029  9/1982  Maxey et al. ........................ 364/511

Primary Examiner—A. D. Pellinen
Assistant Examiner—Hong Choe
Attorney, Agent, or Firm—George B. Fox; James C. Davis, Jr.; Bernard J. Lacomis

[57] ABSTRACT

An apparatus for predicting the remaining useful life of a motor uses the temperature and past history of the motor to determine the amount of insulation degradation for its prediction. The remaining useful life projection is provided at a display and may be used to trip the circuit breakers supplying power to the motor when projected life is shorter than the expected life or may be used to issue a warning that the rate of motor degradation exceeds the rate necessary to achieve the expected life for the motor.

Motor protection is provided by tripping the circuit breakers supplying power to the motor before the actual temperature of the motor windings exceeds the temperature at which catastrophic and irreversible insulation failure would occur while not tripping the breakers for momentary transients.

19 Claims, 9 Drawing Figures

APPARATUS AND METHOD TO PROTECT MOTORS AND TO PROTECT MOTOR LIFE

BACKGROUND OF THE INVENTION

This invention relates to a method for protecting motors and for predicting motor life, and, more particularly, to controlling motor overload and predicting motor life based on the prior history and experience of the motor.

One of the chief factors limiting induction motor life is winding insulation degradation caused by repeated or excessive overheating. Manufacturers typically specify two winding temperature limits: one for steady state and one for transients. Historically, this is done because it is difficult for prior overload protection devices to estimate or model the winding temperature very accurately during transients.

A motor operating under normal conditions is expected to last a certain number of years. However, circuit breakers supplying power to motors are generally either tripped (i.e., opened) at the first sign of an overload condition, thereby causing operational nuisances in the case of transients, or allow the motors to overheat to a certain set point before tripping. In the latter case, since overloads are not controlled (i.e., for example, overloads once an hour are treated the same as overloads once a year), there is a wide distribution in the lifetime of motors because each overload contributes to an incremental loss of the motor's life expectancy.

For a motor to last out its life expectancy, a lifetime control is needed. For example, if a motor has a life expectancy of 40 years, generally it should use up 1/40 of its life each year. If overloads on the motor in one year cause more than 1/40 of its life to be used, an additional annual life must be gained from either the past or the future. If less than 1/40 of its useful life is used in a year then following years may be allowed to use more than 1/40 of its life in order to keep the motor on its lifetime schedule.

In motor operation, it would be useful to determine how much overload the motor should be allowed to withstand, and for how long, in order to keep the motor on its lifetime schedule. Presently there are several ways of detecting motor overloads and protecting motors against overheating. Bimetallic switches, or bi-metals, have been used in the current circuits of motors for many years to estimate motor heating and to trip the power circuit to the motor on overload conditions. However, bi-metals have a relatively large margin of error, a poor transient response and do not take into account previous life history of the motor. Resistive temperature detectors are often embedded in the windings of larger motors and supply currents proportional to temperature to motor protection equipment. Both bi-metals and resistive temperature detectors have short duration memories and operate on fixed temperature limits. Once a motor has cooled down from an overload situation, that event has no more effect on the overload detector. Therefore, except during this cooling down period, each overload is treated independently of each other overload even though each overload is a factor in determining the life expectancy of the motor.

Accordingly, it is an object of the present invention to protect a motor from the effects of overloading by preventing any overload from reducing the life of the motor to less than its original planned life.

Another object of the present invention is to protect a motor from the effects of overloading while eliminating overprotective nuisance circuit breaker trips.

Still another object of the present invention is to provide an indication of the expected remaining useful life of a motor.

Yet another object of the present invention is to prevent catastrophic and irreversible damage to a motor due to insulation deterioration.

SUMMARY OF THE INVENTION

In accordance with the present invention an apparatus for predicting the remaining useful life of a motor comprises model means coupled to the motor for monitoring temperature of the motor windings and generating a failure rate for the motor in response to temperature of the winding thereof, integrating means coupled to the model means for integrating the failure rate to produce a failure incidence for the motor and life projection means coupled to the integrating means for predicting the remaining useful life of the motor.

Further, in accordance with the present invention, a method for predicting the remaining useful life of a motor comprises generating a failure rate for the motor responsive to the motor winding temperature at first and second predetermined instants, integrating the failure rate at the first and second predetermined instants to generate first and second failure incidences, respectively, for the motor, and extrapolating the rate of failure incidence between the first and second predetermined instants to determine a projected time of failure for the motor.

The features of the invention believed to be novel are set forth with particularity in the appended claims. The invention itself, however, both as to organization and method of operation together with further objects and advantages thereof, may best be understood by reference to the detailed description taken in connection with the accompanying drawing.

DETAILED DESCRIPTION

One of the main factors limiting induction motor life is winding insulation degradation due to repeated or excessive overheating. Manufacturers typically specify two winding temperature limits: one for steady state and one for transients. The winding insulation characteristics for a given motor are generally regulated by industry-wide standards such as, for example, Flexible Electrical Insulation, Resins Used as Coating and Coil Impregnants and Coated Electrical Sleeving, each of which is promulgated by the National Electrical Manufacturers Association (NEMA), Washington, D.C. Data from motor manufacturers are currently available on the life of insulation systems versus temperature for classes of motors. In accordance with the present invention these data are used on a real time basis to estimate the reduction in life due to overtemperature and thereby to predict the remaining useful life of a motor and to protect the motor from catastrophic burnout while avoiding nuisance tripping of the circuit breakers supplying power to the motor due to transient current excursions.

Figure 1:
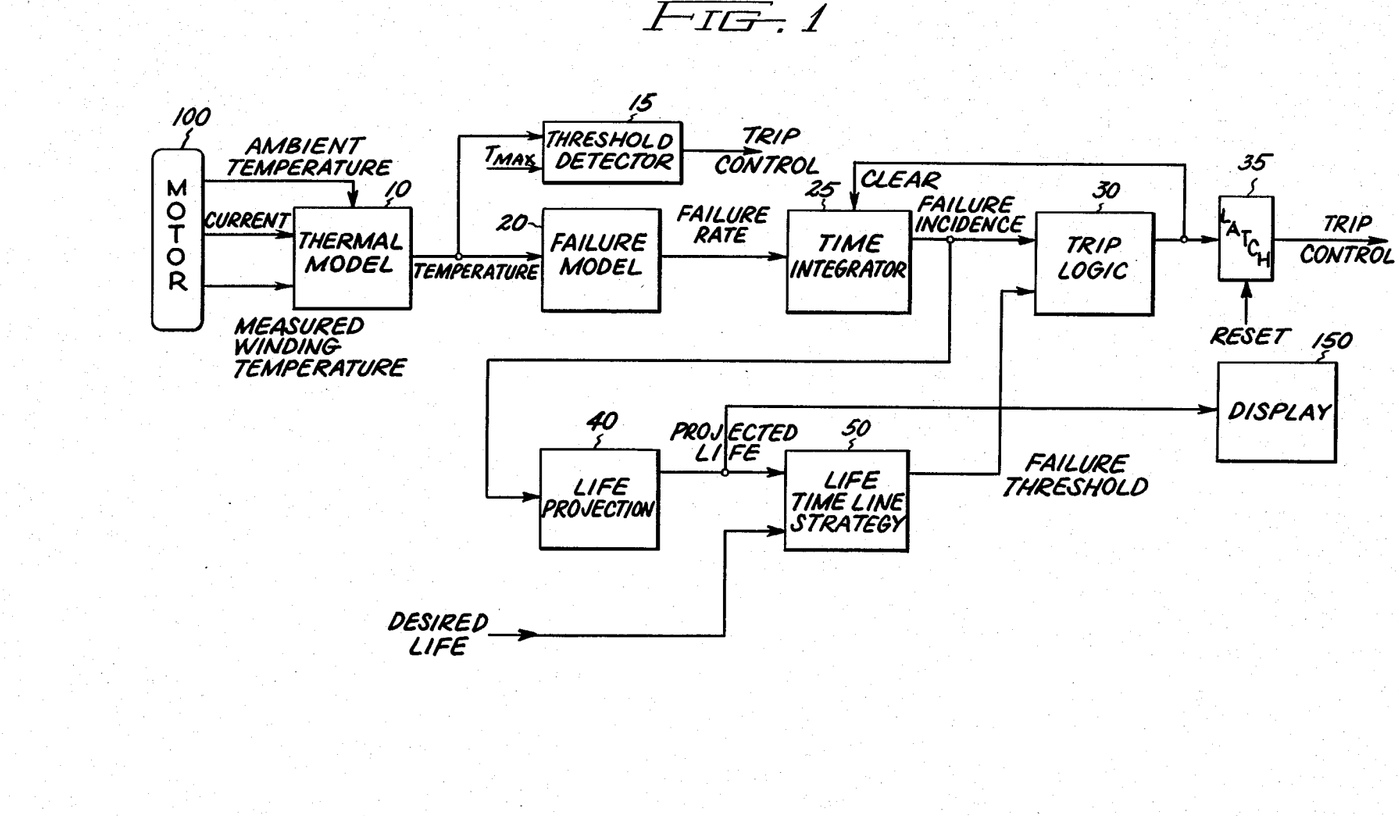
FIG. 1 is a functional block diagram of apparatus to protect motors and predict motor life in accordance with the present invention.

Shown in FIG. 1 is a functional block diagram of apparatus for protecting motors and for predicting life of a motor 100 in accordance with the present invention. The apparatus comprises a thermal model 10, a threshold detector 15, a failure model 20, a time integrator 25, trip logic circuitry 30, life projection circuitry 40 and life timeline strategy circuitry 50, all of which may preferably be implemented by a microprocessor such as a type 8051, manufactured by Intel, as hereinafter described.

Thermal model 10, which may comprise a thermal model such as is described in the application entitled "Generalized Thermal Model", filed concurrently herewith, assigned to the instant assignee and incorporated herein in its entirety by reference, is provided with the ambient temperature, an indication of the current, as from a current transformer, and/or measured winding temperature, as from a thermocouple, from motor 100. The temperature of the motor windings is a function of, among other variables, the current and ambient temperature in which the motor is operating. For a three-phase motor, the current provided to thermal model 10 may be, for example, indicative of the average current of the three phase or the current of any one phase, but is preferably indicative of current from the phase having the maximum current. In a preferred embodiment, samples of the current in each of the three phases are supplied at periodic intervals and in compatible format to a microprocessor 120 (FIG. 6) which controls a program for determining the average current of the three phases and the current of each phase and for selecting the current value supplied to thermal model 10. Such current sampling configuration is disclosed in co-pending application, "Method for Overcurrent Protection"—Premerlani, Ser. No. 373,933, filed May 5, 1982, which is assigned to the instant assignee and is herein incorporated in its entirety by reference. The current sampling program and thermal model 10 are both preferably stored in the same microprocessor and its associated memory, thus simplifying the transfer of data between thermal model 10 and the current sampling programs. Thermal model 10 comprises conversion means, such as preferably a program stored in memory for converting measured values of current, ambient temperature and, if available, winding temperature, of motor 100 into a hot spot temperature. The hot spot temperature is an estimate of the highest temperature experienced by the windings of motor 100. The measured winding temperature, especially for smaller motors, is not always available due in part to size requirements of sensors. Further, the hot spot of a winding is generally near the middle of the windings within a stator slot. Such hot spot is not readily accessible for direct temperature measurement, especially when the motor is operational. Even when the winding temperature is measured directly, as by a thermocouple, there is a lag between the instant a current transient occurs and the time when the measured temperature changes in response to the transient. Thermal model 10 uses the input signals provided thereto to determine a temperature value indicative of the actual winding temperature of motor 100, and provides the temperature value to a first input of threshold detector 15 and to the input of failure model 20. The particular configuration of thermal model 10 used in order to generate an estimate the actual temperature of motor 100, and the location of the sensed temperature sites of motor 100, is determined by the specific characteristics of motor 100, which are available from the manufacturer or may be determined by the user without undue experimentation. If an accurately measured motor winding temperature value is available, then that temperature value, in appropriate format, may be supplied to threshold detector 15 and failure model 20 directly without need of thermal model 10.

A second input of threshold detector 15 is supplied with a maximum temperature limit $T_{max}$, which is the temperature above which power must be immediately removed from motor 100 in order to avoid catastrophic and irreversible damage to the insulation and windings thereof. Threshold detector 15 compares the temperature value from thermal model 10 with temperature limit $T_{max}$ and generates a trip control signal when the temperature value is equal to or greater than temperature limit $T_{max}$. The trip control signal from the output threshold detector 15 is provided to motor control circuitry including circuit breakers (now shown) in order to remove electrical power from the motor.

Failure model 20 provides a failure rate value signal to time integrator circuitry 25. Failure rate, as used herein, refers to the fraction of a relatively large population of identical motors that would be expected to fail in a predetermined interval. Failure rate value is a function of input temperature value to failure model 20 and type of insulation of motor 100 and may be provided, as for example, by a look-up table in memory or analog conversion circuitry.

Time integrator 25 receives the failure rate value signal from failure model 20 at a first input thereof and integrates it to produce a signal representing failure incidence value or projected number of incremental failures lying in the range of 0.0 to 1.0, where 0.0 represents no failures and 1.0 represents enough incremental failures to render the motor no longer operational. The failure incidence value signal is provided from time integral 25 to a first input of trip logic circuitry 30 and to the input of life projection circuitry 40. Life projection circuitry 40 examines the failure incidence value signal during successive pre-determined intervals of time. From these observations, life projection circuitry 40 produces a signal representing projected life value or remaining useful life of the motor, which is provided to a first input of life timeline strategy circuitry 50 (described in detail in conjunction with FIG. 5) and to a display means 150, such as a light emitting diode or liquid crystal, which in turn provides a direct read-out of the projected life of the motor. Projected life represents how long it will take to use up the remaining life of motor 100 if the measured rate of lifetime usage remains constant. Projection circuitry 40 also stores the history of all previous motor degredation and keeps track of the cumulative running time of motor 100.

A desired life signal is provided to a second input of life timeline strategy circuitry 50. Desired life is typically the expected life of motor 100 under normal operating conditions as specified by the manufacturer. However, it may be greater than or less than the normal operating life should the operator desire to have the motor function in a more stressful or less stressful environment, respectively. The desired life signal is typically a manual input of a format which is compatible with the projected life output signal of life projection circuitry 40 or is capable of being conditioned by life timeline strategy circuitry 50 such that the projected life and desired life may be compared by life timeline strategy circuitry 50. Life timeline strategy circuitry 50 generates a failure threshold value signal which is provided to a second input of trip logic circuitry 30.

In certain applications, it is desirable to operate a motor under the maximum temperature or current conditions which do not produce a reduction in the expected life of the motor. With such scheme, predetermined short term overloads, such as at motor start up, are generally permitted. When the temperature or current exceeds the limit which would reduce the expected life of the motor, then a strategy may be chosen, as for example, turning the motor off or issuing a warning of the reduced life expectancy. If a warning is issued, then the operator can decide whether to permit the existing state of operation to continue, to reduce the load on the motor or to stop the motor until it cools below a predetermined temperature. In any case, there is a critical temperature or current versus time above which the circuit breakers supplying power to the motor will be tripped automatically, regardless of which strategy is selected, in order to avoid catastrophic and irreversible failure of the motor due to insulation deterioration.

Trip logic circuitry 30 comprises a comparator receiving both the failure incidence signal and the failure threshold signal and generates a trip signal consituting the output signal from trip logic circuitry 30. The comparator output assumes alternate values: a first value when the value of the failure incidence signal is equal to or greater than the value of the failure threshold signal and a second value when the value of the failure incidence signal is less than the value of the failure threshold signal. The trip signal output of trip logic circuitry 30 is provided to a latch or store circuit 35, which maintains at its output the value of the trip signal until it is reset, and is also provided to a second input of time integrator circuitry 25 in order to reset the integrator. The trip control signal from latch circuit 35 is provided to motor control circuitry including circuit breakers (not shown) in order to remove power from the motor 55 by tripping or opening the circuit breakers. Latch 35 is reset by a signal generated by operator intervention in order to assure that the conditions causing the previous trip signal have been corrected and to prevent restarting motor 100 while any personnel are examining a stopped motor.

Figure 2:
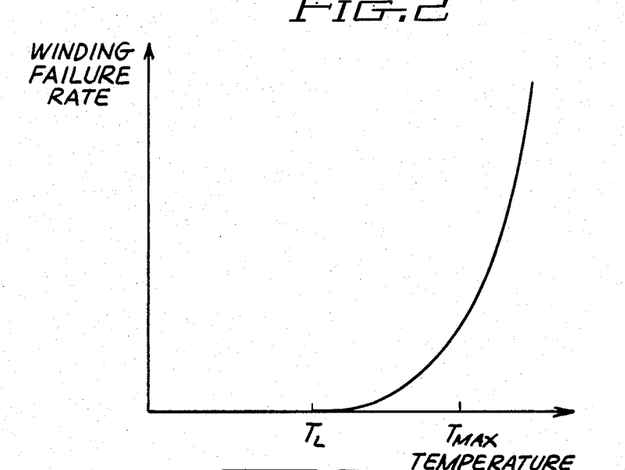
FIG. 2 is a graph depicting motor winding failure rate versus temperature for a typical motor.

Shown in FIG. 2 is a curve depicting winding failure rate versus temperature for a typical motor, which curve may be used to generate a failure model for failure model circuitry 20. The curve has a lower temperature value $T_L$ below which there is an insignificant winding failure rate and the motor is permitted to run indefinitely. Between lower temperature $T_L$ and a higher temperature $T_{MAX}$, winding failure rate increases. Above higher temperature $T_{MAX}$, winding failure rate increases dramatically, such that burn-out or catastrophic failure is likely to occur if motor 100 is continued to be operated above this temperature.

Figure 3:
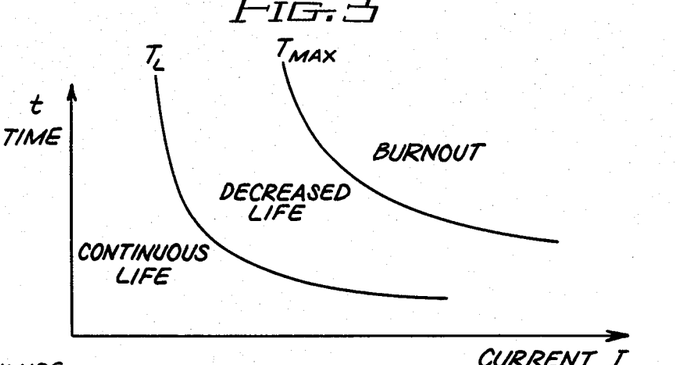
FIG. 3 is a graph of typical motor operation.

Shown in FIG. 3 is a graph of the interval of time a value of current is permitted to flow through a typical motor versus the value of current. Heating value or temperature rise, due to current of a given motor, is equal to some constant times the square of the value of current. The constant is a function of the size and type of motor, and is available from the manufacturer or can be ascertained by the user without undue experimentation. For the region of the curve to the left of, or below, low temperature line, $T_L$, the motor is allowed to run continuously without temperature affecting the expected lifetime of the insulation of the windings. In the region between low temperature line $T_L$ and high temperature line $T_{MAX}$, the motor is operated at a cost of increasing insulation degradation and thereby reducing the expected lifetime of the motor. In the region above high temperature line, $T_{MAX}$, the current must be reduced or the motor must be turned off in order to avoid catastrophic insulation failure and burn-out of the motor.

Figure 4:
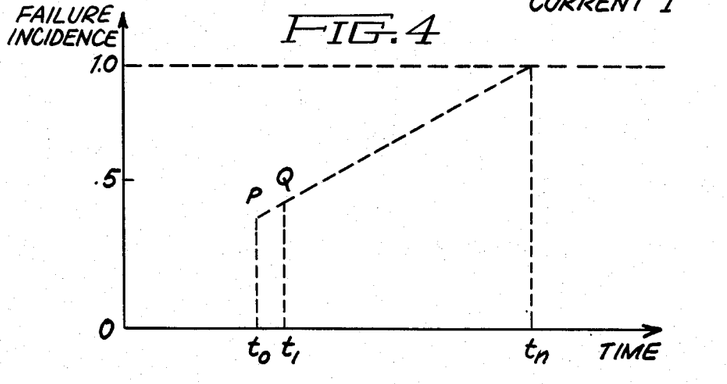
FIG. 4 is a graph exemplary of motor life prediction in accordance with the present invention.

Shown in FIG. 4 is a life projection graph of failures versus time. A failure incidence of 1.0 indicates that the motor is no longer operational. For example, at some arbitrary time $t_o$, the failure incidence may have a value as indicated by point P. At some later, time $t_l$, which is determined by the update interval or time base of the time integrator circuit 25 (FIG. 1), the failure incidence may be at point Q. By linearly extrapolating the line between P and Q until it intersects the line showing a failure incidence of 1.0, a time $t_n$ may be determined. The time between $t_l$ and $t_n$ represents the expected remaining lifetime of the motor if the motor failure rate continues at the same rate as between time $t_o$ and time $t_l$.

Figure 5:
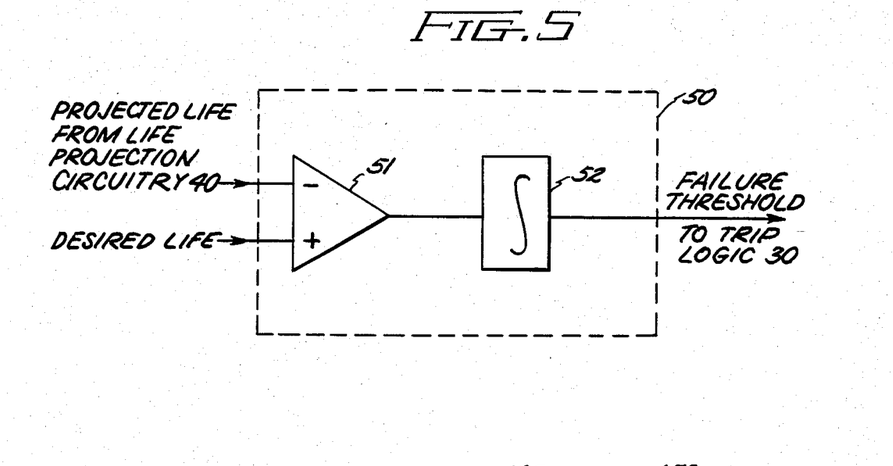
FIG. 5 is a schematic diagram of life time-line strategy circuitry in accordance with the present invention.

Shown in FIG. 5 is a functional block diagram of life timeline strategy circuitry 50. Life timeline strategy circuitry 50 comprises a comparator 51 and an integrator 52. The inverting input of comparator 51 receives a projected life signal from life projection circuitry 40 (FIG. 1) and the desired life of the motor signal is provided to the noninverting input of comparator 51. The output of comparator 51 is coupled to the input of integrator 52. The output of integrator 52, which also constitutes the output of life timeline strategy circuitry 50, is coupled to the second input of trip logic circuitry 30 (FIG. 1). Integrator 52 smooths momentary deviations in the output signal from comparator 51 and also takes the average of the signal from the output of comparator 51. Comparator 51 provides a positive output signal if the desired life is greater than or equal to the projected life and provides a negative output signal of equal magnitude if the projected life is greater than the desired life. If on average the projected life is greater than the desired life, then the failure threshold output of integrator 52 will be decreased whereas if on average the desired life is greater than the projected life, then the failure threshold value from integrator 52 will be increased thus permitting more stressful and less stressful operation of motor 100 (FIG. 1), respectfully, before a trip signal is generated by trip logic circuitry 30 (FIG. 1). If on average the projected life is equal to the desired life, then the threshold value level from integrator 52 will remain at its previous value.

Figure 6:
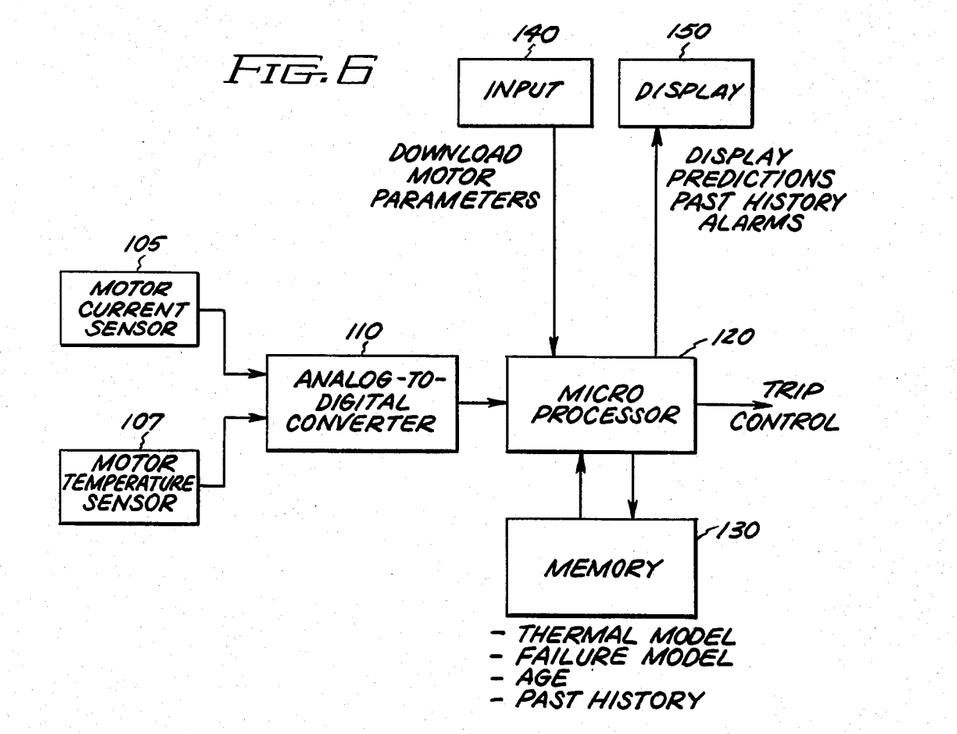
FIG. 6 is a schematic block diagram of a presently preferred embodiment for implementing the methods of the present invention.

Shown in FIG. 6 is a block diagram of the apparatus in a presently preferred embodiment of the present invention. A microprocessor 120 such as a type 8031 manufactured by Intel or the like, has an associated memory unit 130, such as a type 2148 RAM manufactured by Intel or the like, from which and to which information may be received and transferred, respectively, by microprocessor 120. Motor 100 of FIG. 1 may have a current sensor 105 or temperature sensor 107 or both coupled thereto. Current sensor 105 and temperature sensor 107 provide analog signals indicative of the current and winding temperature, respectively, of motor 100 to analog to digital converter 110. Analog to digital converter 110 conditions the signals supplied thereto and provides digital signals having the current value and temperature value encoded therein to microprocessor 120. Microprocessor 120 also receives digitally compatible signals from input circuitry 140. Input circuitry 140, which comprises an I/O console such as a keyboard or, alternatively, a computer or another microprocessor, is used to manually supply the parameters, such as, for example, look-up tables, used to define thermal model 10 (FIG. 1) and failure model 20 (FIG. 1), as hereinbefore described, to microprocessor 120 in the form of digital signals for eventual storage in memory 130. Microprocessor 120 provides signals to display unit 150, which comprises a light emitting diode or alternatively a liquid crystal or incandescent lamp projection read-out such as is available from Master Specialties Company and conditioning circuitry for conforming the signals received from microprocessor 120 to be compatible with the particular display used, and displays predictions, past history and alarms for motor 100. Microprocessor 120 also provides a trip control signal to motor control circuitry (not shown) for stopping motor 100.

Memory 130 has embedded therein thermal and failure models, age and past history of motor 100. Functions stored in memory 130 are readily accessible to microprocessor 120 for subsequent transmission to display unit 150, through control signals provided to memory 130 by microprocessor 120. Although shown as a separate unit, memory 130 may be an integral part of microprocessor 120.

Figure 7:
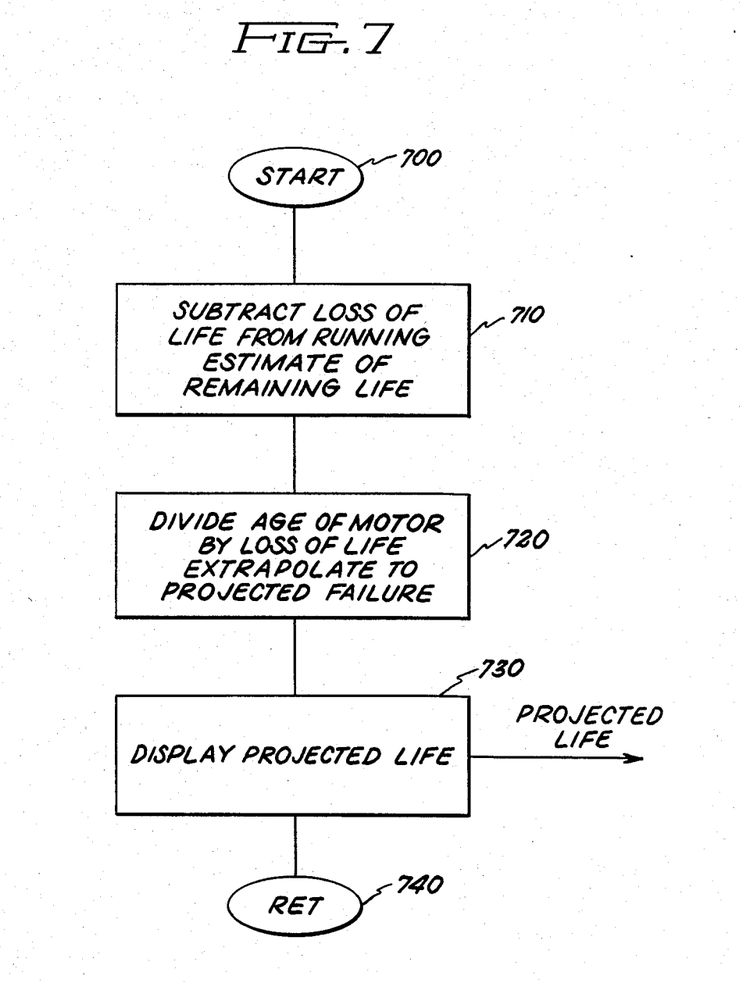
FIG. 7 is a logic flow diagram of motor life prediction in accordance with the present invention.

Shown in FIG. 7 is a logic flow diagram of life projection circuitry 40 (FIG. 1) of a preferred embodiment of the present invention, which is programmed into microprocessor 120 (FIG. 6) and is stored in memory 130. The program starts at step 700 and proceeds to step 710, at which time the incremental loss of life or failure is subtracted from a running estimate of the remaining life of the motor. The program proceeds to step 720, dividing the age of the motor by the total loss of life of the motor and extrapolating to a projected failure. After step 720, the program executes step 730 by providing an output signal representative of the projected life of the motor for display at display means 150 (FIG. 1) and input to life timeline strategy circuitry 50 (FIG. 1). After executing step 730, the program executes step 740 to return to step 700.

Figure 8:
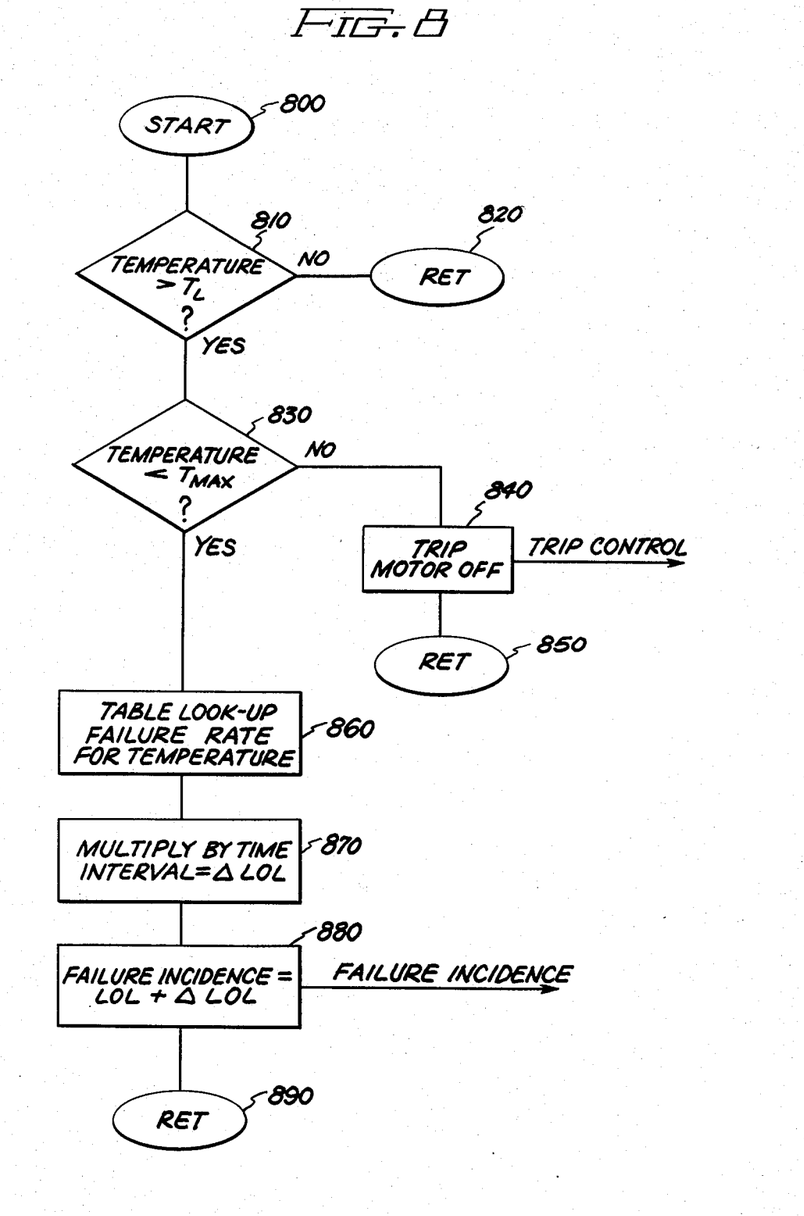
FIG. 8 is a logic flow diagram of a method for motor protection in accordance with the present invention.

Shown in FIG. 8 is a logic flow diagram of the motor protection feature of a preferred embodiment of the present invention. The program begins at step 800 and executes step 810 by determining whether the temperature of the motor is greater than temperature $T_L$. If the temperature of the motor is not greater than $T_L$, the program returns to the start step 800. If the temperature of the motor is greater than temperature $T_L$, the program executes step 830 by determining whether the temperature of the motor is less than temperature $T_{MAX}$. If the temperature of the motor is greater than temperature $T_{MAX}$, then the program executes step 840 by generating a trip control signal which is used to turn the motor off in order to prevent catastrophic failure due to overheating of the insulation. After step 840 the program returns to start step 800. If the temperature of the motor is less than temperature $T_{MAX}$ then the program executes step 860 by determining the failure rate for the motor using the temperature of the motor 100 as an index to a look-up table. The program proceeds to execute step 870 by multiplying the failure rate determined at step 860 by the time interval between successive performances of step 860 to produce an incremental loss of life ($\Delta LOL$). The program proceeds to execute step 880 by adding the incremental loss of life to the accumulated value (LOL) of all previous incremental loss of life which new accummulated value is used as the failure incidence signal supplied to trip logic circuitry 30 (FIG. 1). After executing step 880, the program executes step 890 to return to step 800.

Figure 9:
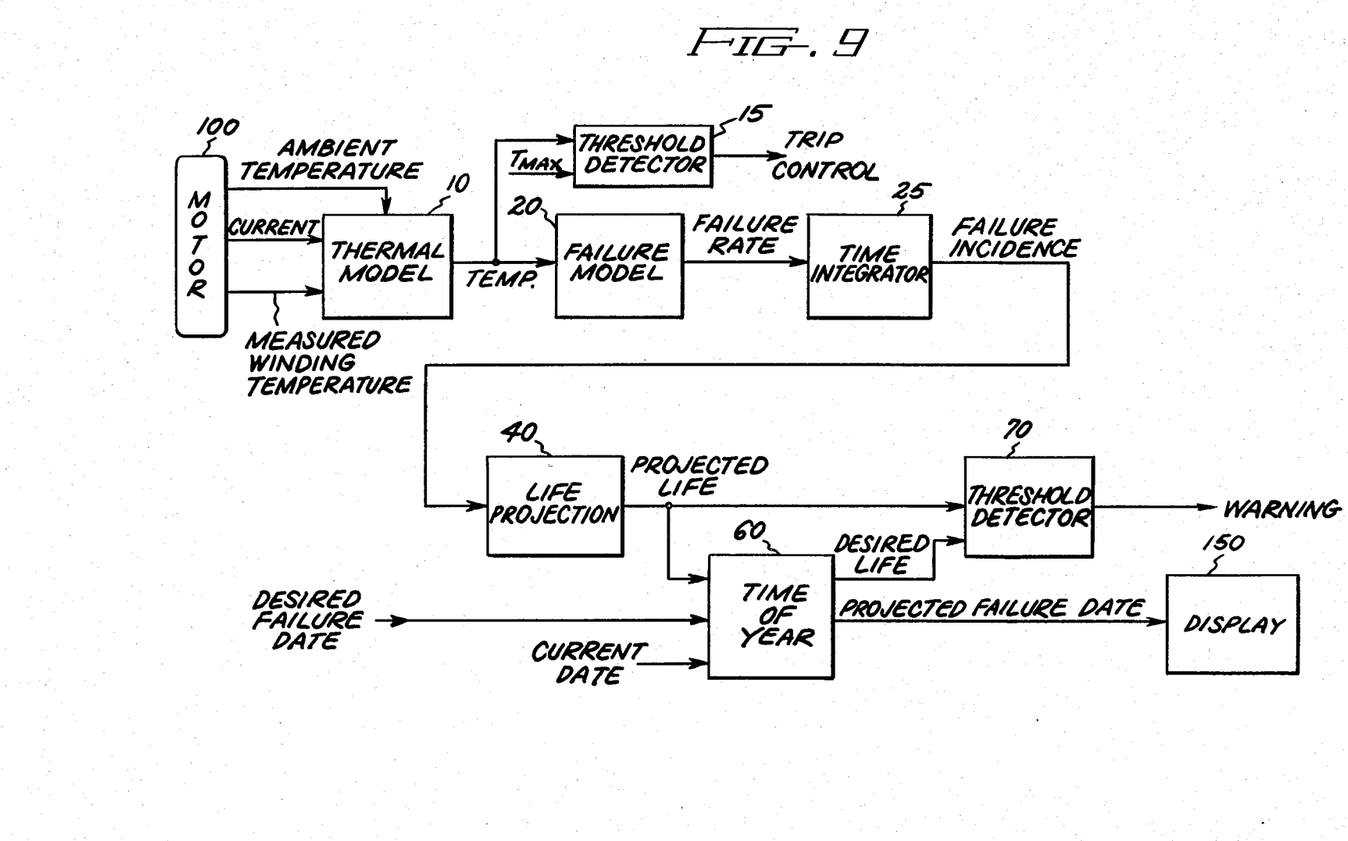
FIG. 9 is another block diagram of apparatus to protect motors and predict motor life in accordance with the present invention.

Shown in FIG. 9 is a block diagram of another embodiment of the present invention. Thermal model 10, threshold detector 15, failure model 20, time integral circuitry 25, life projection circuitry 40 and display circuitry 150 function as hereinbefore described. Time of year circuitry 60, which in a preferred embodiment is implemented as part of the microprocessor program stored in memory 130 receives the current date as a digitally encoded signal at a first input thereto. A second input of time of year circuitry 60 is provided with the desired failure date signal and a third input thereto is supplied with the projected life signal from life projection circuitry 40. Time of year circuitry 60, having a calendar table stored therein, converts the desired failure date to the desired life and the projected life to the projected failure date. The projected failure signal from a first output of time of year circuitry 60 is supplied to display means 150 whereat the projected failure date is displayed. The desired life signal from a second output of time of year circuitry 60 is provided to a first input of threshold detector 70. A second input of threshold detector 70 is supplied with the projected life signal from the output of life projection circuitry 40.

Threshold detector 70 compares the projected life and the desired life of the motor and issues a warning signal when the projected life is less than the desired life. The warning signal may be used to provide a visual or audible signal for an operator.

In many process operations, an operator is interested in knowing what the remaining life of the motor is rather than that he is decreasing the desired life of the motor. From an estimation of the remaining life of the motor, replacement of the motor can be scheduled at a convenient time in order to prevent the disruptive and wasteful experience of having a motor fail during a critical phase of a process.

Thus has been described a method for protecting a motor from the effects of overloading by preventing an overload from reducing the life of the motor to less than its original planned life while eliminating over-protective nuisance trips. Also, an indication is provided of the expected remaining useful life of a motor.

While only certain preferred features of the invention have been shown by way of illustration, many modifications and changes will occur to those skilled in the art. It is to be understood that the appended claims are intended to cover all such modifications and changes as fall within the true spirit and scope of the invention.

What is claimed is:

1. Apparatus for predicting the remaining useful life of a motor comprising:
   (a) model means coupled to said motor for monitoring temperature of the windings of the motor and for generating a failure rate for said motor in response to temperature of the windings thereof;
   (b) integrating means coupled to said model means for integrating the failure rate to produce a failure incidence for said motor; and
   (c) life projection means coupled to said integrating means for predicting the remaining useful life of said motor.

2. The apparatus of claim 1 wherein said model means comprises a pre-determined look-up table.

3. The apparatus of claim 1 wherein said model means is responsive to current in said motor.

4. The apparatus of claim 3 wherein said model means is responsive to the motor winding phase having the largest current.

5. The apparatus of claim 3 wherein said model means is responsive to the average current of the motor winding phases.

6. The apparatus of claim 1 further comprising display means coupled to said life projection means for displaying the remaining useful life of said motor.

7. The apparatus of claim 1 further comprising:
   (a) life timeline strategy means coupled to said life projection means and adapted to receive a signal representing the desired life of said motor for generating a failure threshold responsive to both the remaining useful life and the desired life of said motor; and
   (b) trip logic circuitry coupled to said integrating means and said life timeline strategy means for receiving said failure incidence and said failure threshold, respectively, and for generating a trip signal in response thereto.

8. The apparatus of claim 7 wherein said life timeline strategy means comprises:
   (a) a comparator having an inverting and non-inverting input, said comparator adapted to receive the projected life signal at the inverting input thereof and the desired life signal at the non-inverting input thereof; and
   (b) an integrator having an input coupled to the output of said comparator and an output having the failure threshold signal available thereat.

9. The apparatus of claim 1 further comprising a threshold detector coupled to said life projection means and adapted to receive a desired life of the motor signal at a first input thereof and a projected motor life signal available from the output of said life projection means at a second input thereof for generating a warning signal when the value of said desired life of the motor is less than the value of said projected motor life signal.

10. The apparatus of claim 9 further comprising time of year circuitry having the current date provided thereto wherein said time of year circuitry is coupled to said life projection circuitry and adapted to receive said projected life signal for producing a projected failure date signal and adapted to receive a desired failure date for producing said desired life signal.

11. The apparatus of claim 10 further comprising display means coupled to said time of year circuitry and adapted to receive said projected failure date signal for displaying the projected failure date.

12. A method for predicting the remaining useful life of a motor comprising:
   (a) generating a failure rate for the motor responsive to the temperature of the windings of the motor at a first predetermined instant;
   (b) integrating the failure rate to generate a first failure incident for the motor;
   (c) repeating steps a and b at a second predetermined instant to generate a second failure incident for the motor; and
   (d) extrapolating the rate of failure incidence between said first and second predetermined instants to determine a projected time of failure for the motor.

13. The method of claim 12 further comprising substracting the present life of the motor from the projected time of failure to determine the remaining useful life of the motor.

14. The method of claim 13 further comprising:
   (a) comparing the sum of the remaining useful life plus the present life of the motor with a desired life of the motor to generate a failure threshold; and
   (b) controlling operation of the motor in response to the failure threshold.

15. The method of claim 14 wherein controlling operation of the motor includes turning off power to the motor when the sum of the remaining useful life plus the present life is less than the desired life of the motor.

16. The method of claim 14 wherein controlling operation of the motor includes providing a warning signal when the sum of the remaining useful life plus the present life is less than the desired life of the motor.

17. The method of claim 14 wherein said failure threshold is decreased when the desired life of the motor is less than the sum of the remaining useful life plus the present life thereof.

18. The method of claim 14 wherein said failure threshold is increased when the desired life of the motor is greater than the sum of the remaining useful life plus the present life thereof.

19. Apparatus for generating an indication of elapsed motor life, comprising:
   model means coupled to said motor for generating different failure rate factors as a function of the instantaneous temperature of the windings of said motor; and
   integrating means coupled to said model means for generating an indication of elapsed motor life as a function of said factors and motor operating time.

* * * * *